United States Patent
Markov et al.

(10) Patent No.: US 11,309,042 B2
(45) Date of Patent: Apr. 19, 2022

(54) METHOD OF IMPROVING READ CURRENT STABILITY IN ANALOG NON-VOLATILE MEMORY BY PROGRAM ADJUSTMENT FOR MEMORY CELLS EXHIBITING RANDOM TELEGRAPH NOISE

(71) Applicant: Silicon Storage Technology, Inc., San Jose, CA (US)

(72) Inventors: Viktor Markov, Santa Clara, CA (US); Alexander Kotov, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/915,289

(22) Filed: Jun. 29, 2020

(65) Prior Publication Data

US 2021/0407602 A1    Dec. 30, 2021

(51) Int. Cl.
| | |
|---|---|
| *G11C 11/34* | (2006.01) |
| *G11C 16/34* | (2006.01) |
| *G11C 16/14* | (2006.01) |
| *G11C 16/26* | (2006.01) |
| *G11C 16/10* | (2006.01) |
| *G11C 16/04* | (2006.01) |

(52) U.S. Cl.
CPC ........ *G11C 16/3454* (2013.01); *G11C 16/107* (2013.01); *G11C 16/14* (2013.01); *G11C 16/26* (2013.01); *G11C 16/3404* (2013.01); *G11C 16/0425* (2013.01)

(58) Field of Classification Search
CPC ..... G11C 16/3454; G11C 16/14; G11C 16/26; G11C 16/107; G11C 16/3404; G11C 16/0425

USPC .................................................. 365/185.22
See application file for complete search history.

(56) References Cited

U.S. PATENT DOCUMENTS

| | | |
|---|---|---|
| 5,029,130 A | 7/1991 | Yeh |
| 6,747,310 B2 | 6/2004 | Fan et al. |
| 6,855,980 B2 | 2/2005 | Wang et al. |
| (Continued) | | |

OTHER PUBLICATIONS

*Negative bias temperature instability: What do we understand?* By Dieter K. Schroder, in Microelectronics Reliability 47 (2007) 841-852, Department of Electrical Engineering and Center for Solid State Electronics Research, Arizona State University, Tempe, AZ 85287-5706, USA.

(Continued)

*Primary Examiner* — Hoai V Ho
*Assistant Examiner* — Minh Dinh
(74) *Attorney, Agent, or Firm* — DLA Piper LLP (US)

(57) ABSTRACT

A method and device for programming a non-volatile memory cell, where the non-volatile memory cell includes a first gate. The non-volatile memory cell is programmed to an initial program state that corresponds to meeting or exceeding a target threshold voltage for the first gate of the non-volatile memory cell. The target threshold voltage corresponds to a target read current. The non-volatile memory cell is read in a first read operation using a read voltage applied to the first gate of the non-volatile memory cell that is less than the target threshold voltage to generate a first read current. The non-volatile memory cell is subjected to additional programming in response to determining that the first read current is greater than the target read current.

18 Claims, 5 Drawing Sheets

(56) References Cited

U.S. PATENT DOCUMENTS

| | | | |
|---|---|---|---|
| 7,315,056 B2 | 1/2008 | Klinger | |
| 7,868,375 B2 | 1/2011 | Liu et al. | |
| 8,711,636 B2 | 4/2014 | Do et al. | |
| 8,908,441 B1 | 12/2014 | Dutta et al. | |
| 2005/0083735 A1 | 4/2005 | Chen et al. | |
| 2008/0175055 A1 | 7/2008 | Kim | |
| 2012/0008389 A1* | 1/2012 | Kim | G11C 11/5642 |
| | | | 365/185.03 |
| 2012/0113714 A1 | 5/2012 | Choy et al. | |
| 2012/0269004 A1 | 10/2012 | Kim et al. | |
| 2013/0039130 A1* | 2/2013 | Lee | G11C 16/3427 |
| | | | 365/185.19 |
| 2016/0019948 A1 | 1/2016 | Pang et al. | |
| 2016/0077912 A1* | 3/2016 | Mateescu | G11C 11/5628 |
| | | | 714/764 |
| 2017/0337466 A1* | 11/2017 | Bayat | G06F 3/0688 |
| 2020/0065023 A1 | 2/2020 | Markov et al. | |

OTHER PUBLICATIONS

U.S. Appl. No. 16/828,206, filed Mar. 24, 2020 entitled "Method of Improving Read Current Stability in Analog Non-Volatile Memory by Screening Memory Cells," Markov, et al., specification and drawings.

PCT Search Report and Written Opinion dated May 3, 2021 from the related PCT Patent Application No. US2021/017007 filed on Feb. 8, 2021,.

* cited by examiner

METHOD OF IMPROVING READ CURRENT STABILITY IN ANALOG NON-VOLATILE MEMORY BY PROGRAM ADJUSTMENT FOR MEMORY CELLS EXHIBITING RANDOM TELEGRAPH NOISE

FIELD OF THE INVENTION

The present invention relates to non-volatile memory devices, and more particularly to improving the stability of the memory cell current during read operations.

BACKGROUND OF THE INVENTION

Non-volatile memory devices are well known in the art. See for example U.S. Pat. No. 7,868,375, which discloses a four-gate memory cell configuration, and which is incorporated herein by reference. Specifically, FIG. 1 of the present application illustrates a split gate memory cell 10 with spaced apart source and drain regions 14/16 formed in a silicon semiconductor substrate 12. The source region 14 can be referred to as a source line SL (because it commonly is connected to other source regions for other memory cells in the same row or column), and the drain region 16 is commonly connected to a bit line by a bit line contact 28. A channel region 18 of the substrate is defined between the source/drain regions 14/16. A floating gate 20 is disposed over and insulated from (and controls the conductivity of) a first portion of the channel region 18 (and partially over and insulated from the source region 14). A control gate 22 is disposed over and insulated from the floating gate 20. A select gate 24 is disposed over and insulated from (and controls the conductivity of) a second portion of the channel region 18. An erase gate 26 is disposed over and insulated from the source region 14 and is laterally adjacent to the floating gate 20. A plurality of such memory cells can be arranged in rows and columns to form a memory cell array.

Various combinations of voltages are applied to the control gate 22, select gate 24, erase gate 26 and/or source and drain regions 14/16, to program the memory cell (i.e., injecting electrons onto the floating gate), to erase the memory cell (i.e., removing electrons from the floating gate), and to read the memory cell (i.e., measuring or detecting the conductivity of the channel region 18 to determine the programming state of the floating gate 20).

Memory cell 10 can be operated in a digital manner, where the memory cell is set to one of only two possible states: a programmed state and an erased state. The memory cell is erased by placing a high positive voltage on the erase gate 26, and optionally a negative voltage on the control gate 22, to induce tunneling of electrons from the floating gate 20 to the erase gate 26 (leaving the floating gate in a more positively charged stated—the erased state). Memory cell 10 can be programmed by placing positive voltages on the control gate 22, erase gate 26, select gate 24 and source region 14, and a current on drain region 16. Electrons will then flow along the channel region 18 from the drain region 16 toward the source region 14, with electrons becoming accelerated and heated whereby some of them are injected onto the floating gate 20 by hot-electron injection (leaving the floating gate in a more negatively charged state—the programmed state). Memory cell 10 can be read by placing positive voltages on the select gate 24 (turning on the channel region portion under the select gate 24) and drain region 16 (and optionally on the erase gate 26 and/or control gate 22), and sensing current flow through the channel region 18. If the floating gate 20 is positively charged (memory cell is erased), the memory cell will be turned on, and electrical current will flow from source region 14 to drain region 16 (i.e. the memory cell 10 is sensed to be in its erased "1" state based on sensed current flow). If the floating gate 20 is negatively charged (memory cell is programmed), the channel region under the floating gate is turned off, thereby preventing any current flow (i.e., the memory cell 10 is sensed to be in its programmed "0" state based on no current flow).

Table 1 provides non-limiting examples of erase, program and read voltages, where Vcc is power supply voltage or another positive voltage such as 2.5 V.

TABLE 1

|         | WL (SG) | BL (Drain) | Source | EG     | CG      |
|---------|---------|------------|--------|--------|---------|
| Erase   | 0 V     | 0 V        | 0 V    | 11.5 V | 0 V     |
| Program | 1 V     | 1 μA       | 4.5 V  | 4.5 V  | 10.5 V  |
| Read    | Vcc     | 0.6 V      | 0 V    | 0 V    | Vcc     |

Memory cell 10 can alternately be operated in an analog manner where the memory state (i.e. the amount of charge, such as the number of electrons, on the floating gate) of the memory cell can be continuously changed anywhere from a fully erased state (fewest electrons on the floating gate) to a fully programmed state (highest number of electrons on the floating gate), or just a portion of this range. This means the cell storage is analog, which allows for very precise and individual tuning of each memory cell in the memory cell array. Alternatively, the memory could be operated as an MLC (multilevel cell) where it is configured to be programmed to one of many discrete values (such as 16 or 64 different values). In the case of analog or MLC programming, the programming voltages are applied for only a limited time, or as a series of pulses, until the desired programming state is achieved. In the case of multiple programming pulses, intervening read operations between programming pulses can be used to determine if the desired programming state has been achieved (in which case programming ceases) or has not been achieved (in which case programming continues).

Memory cell 10 operated in an analog manner or as an MLC could be more sensitive to noise and read current instabilities which can adversely affect the accuracy of the memory device. One source of read current instability in analog non-volatile memory devices is the capture and emission of electrons by oxide traps located at the interface and near-interface between the gate oxide and memory cell channel region. The gate oxide is the insulation layer that separates the floating gate 20 and the channel region 18 of substrate 12. When an electron is captured on an interface trap, it reduces the channel conductivity during a read operation, and thus increases the threshold voltage Vt of the memory cell (i.e., the minimum voltage on the control gate needed to turn on the channel region of the memory cell to produce a certain level of current, 1 μA being an example). When the control gate voltage is at or above the threshold voltage, a conducting path is created between the source and drain regions. When the control gate voltage is below the threshold voltage, a conducting path is not created, and any source/drain current is considered sub-threshold or leakage current. An electron captured on an interface trap can be emitted from the trap, which decreases Vt of the memory cell, and thus increases the channel conductivity during a read operation. These single-electron events of electron capture and emission by trap appear as read current noise and are referred to as random telegraph noise (RTN) elsewhere. In general, RTN produced by a single interface trap is characterized by two states: lower Vt state (and higher read current state) when electron is emitted from the trap and higher Vt state (and lower read current state) when electron is captured by the trap. As shown above, the instability of the memory cell during read can be characterized either by threshold voltage corresponding to the target current or by memory cell current under given read voltage conditions. A preferable way of characterization of memory cell read instability is threshold voltage which is used in the detailed description of the invention.

There is a need to address RTN in analog and MLC non-volatile memory devices when memory cells are being programmed to certain desired programming states.

BRIEF SUMMARY OF THE INVENTION

The aforementioned problems and needs are addressed by a memory device that includes a plurality of non-volatile memory cells each comprising a first gate and a controller. The controller is configured to program one non-volatile memory cell of the plurality of non-volatile memory cells by programming the one non-volatile memory cell to an initial program state that corresponds to meeting or exceeding a target threshold voltage for the first gate of the one non-volatile memory cell, wherein the target threshold voltage corresponds to a target read current, reading the one non-volatile memory cell in a first read operation using a read voltage applied to the first gate of the one non-volatile memory cell that is less than the target threshold voltage to generate a first read current, and subjecting the one non-volatile memory cell to additional programming in response to determining that the first read current is greater than the target read current.

A method of programming one non-volatile memory cell of a plurality of non-volatile memory cells, wherein each of the plurality of non-volatile memory cells includes a first gate, includes programming the one non-volatile memory cell to an initial program state that corresponds to meeting or exceeding a target threshold voltage for the first gate of the one non-volatile memory cell, wherein the target threshold voltage corresponds to a target read current, reading the one non-volatile memory cell in a first read operation using a read voltage applied to the first gate of the one non-volatile memory cell that is less than the target threshold voltage to generate a first read current, and subjecting the one non-volatile memory cell to additional programming in response to determining that the first read current is greater than the target read current.

Other objects and features of the present invention will become apparent by a review of the specification, claims and appended figures.

DETAILED DESCRIPTION OF THE INVENTION

Figure 1:
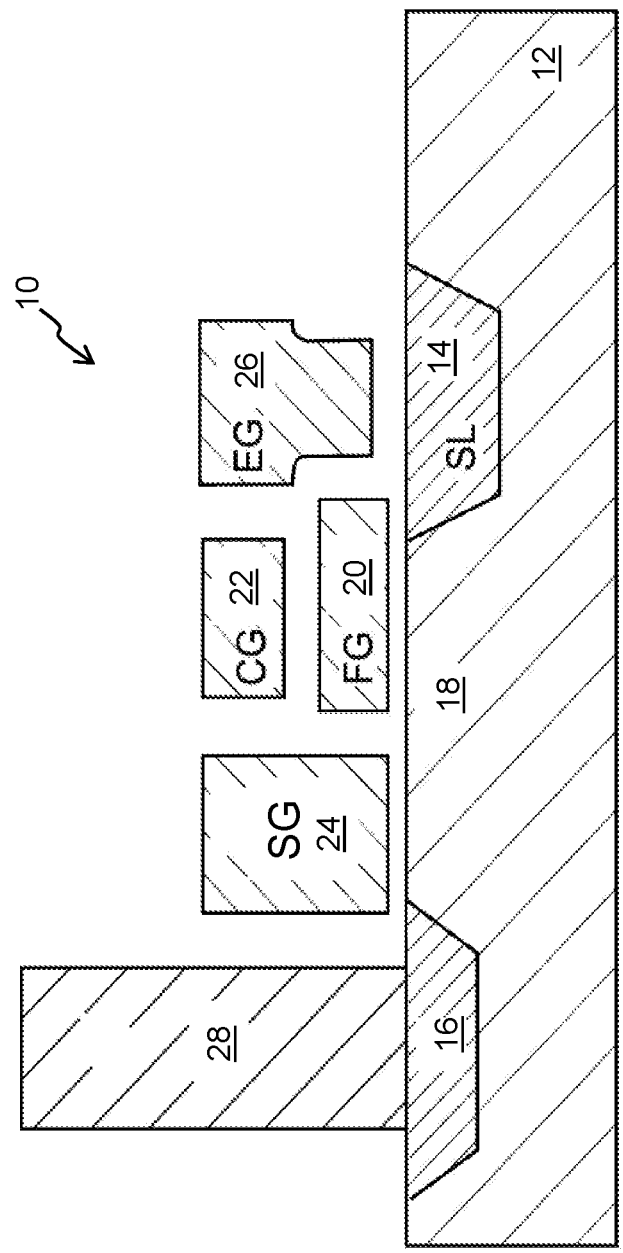
FIG. 1 is a side cross sectional view of a memory cell of the prior art.

The present invention is a technique for compensating for RTN when programming memory cells of the type of FIG. 1 to improve read operation accuracy. The program compensation technique involves detecting memory cells in the memory array that exhibit RTN above a predetermined tolerance level, and compensating programming of those memory cells accordingly.

Figure 2:
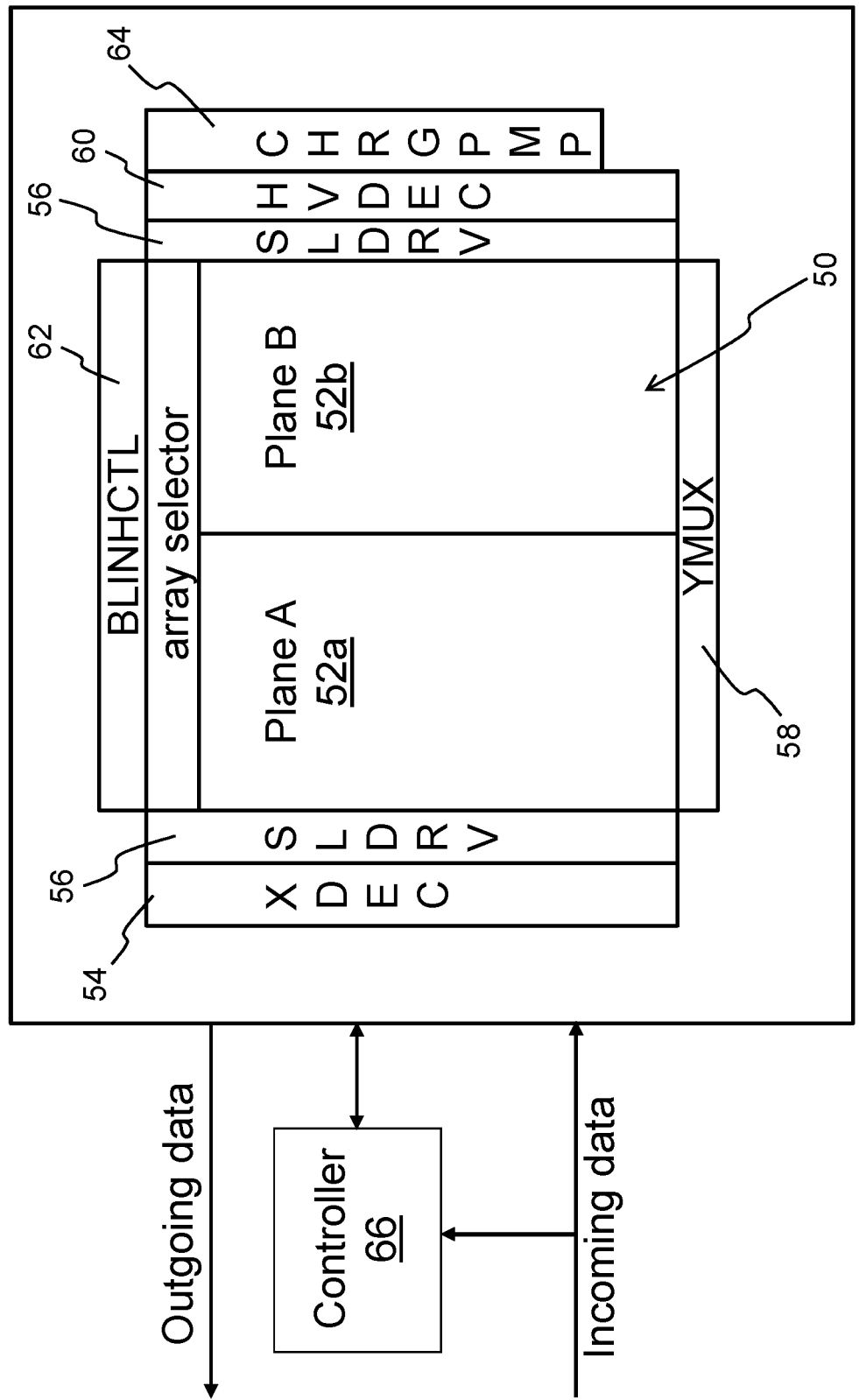
FIG. 2 is a diagram illustrating the components of a memory device.

The program compensation technique is implemented as part of the controller configuration for the memory array, which can be better understood from the architecture of an exemplary memory device as illustrated in FIG. 2. The memory device includes an array 50 of the non-volatile memory cells 10, which can be segregated into two separate planes (Plane A 52a and Plane B 52b). The memory cells 10 can be of the type shown in FIG. 1, formed on a single chip, arranged in a plurality of rows and columns in the semiconductor substrate 12. Adjacent to the array of non-volatile memory cells are address decoders (e.g. XDEC 54), a source line driver (e.g. SLDRV 56), a column decoder (e.g. YMUX 58), a high voltage row decoder (e.g. HVDEC 60) and a bit line controller (e.g. BLINHCTL 62), which are used to decode addresses and supply the various voltages to the various memory cell gates and regions during read, program, and erase operations for selected memory cells. Column decoder 58 includes a sense amplifier containing circuitry for measuring the currents on the bit lines during a read operation. Controller 66 (containing control circuitry) controls the various device elements to implement each operation (program, erase, read) on target memory cells. Charge pump CHRGPMP 64 provides the various voltages used to read, program and erase the memory cells under the control of the controller 66. Controller 66 is configured to operate the memory device to program, erase and read the memory cells 10. As part of these operations, the controller 66 can be provided with access to the incoming data which is data to be programmed to the memory cells, along with program, erase and read commands provided on the same or different lines. Data read from the memory array is provided as outgoing data.

The program compensation technique involves the controller 66 implementing memory cell programming, and specifically providing additional programming for memory cells that exhibit an intolerable level of read current instability. This technique involves initially programming memory cell to a particular programming state and taking one or multiple measurements of a memory cell threshold voltage parameter (i.e., a minimum voltage applied to the memory cell to achieve a certain level of source/drain current, referred to as a target current $I_{target}$). The preferable threshold voltage parameter is Vtcg, which is the threshold voltage of the memory cell as viewed from the control gate 22. Specifically, the control gate threshold voltage Vtcg is the voltage on the control gate that results in the channel region being a conducting path, and therefore results in a read current through the channel of a predetermined amount ($I_{target}$) to consider the memory cell turned on (e.g., 1 µA) when the read potentials of a read operation are applied to the select gate 24 and drain region 16. The control gate threshold voltage Vtcg will vary as a function of programming state of the memory cell, but it is desired that once the memory cell is programmed to a particular programming state, any variation of Vtcg over time be below a predetermined amount.

Figure 3:
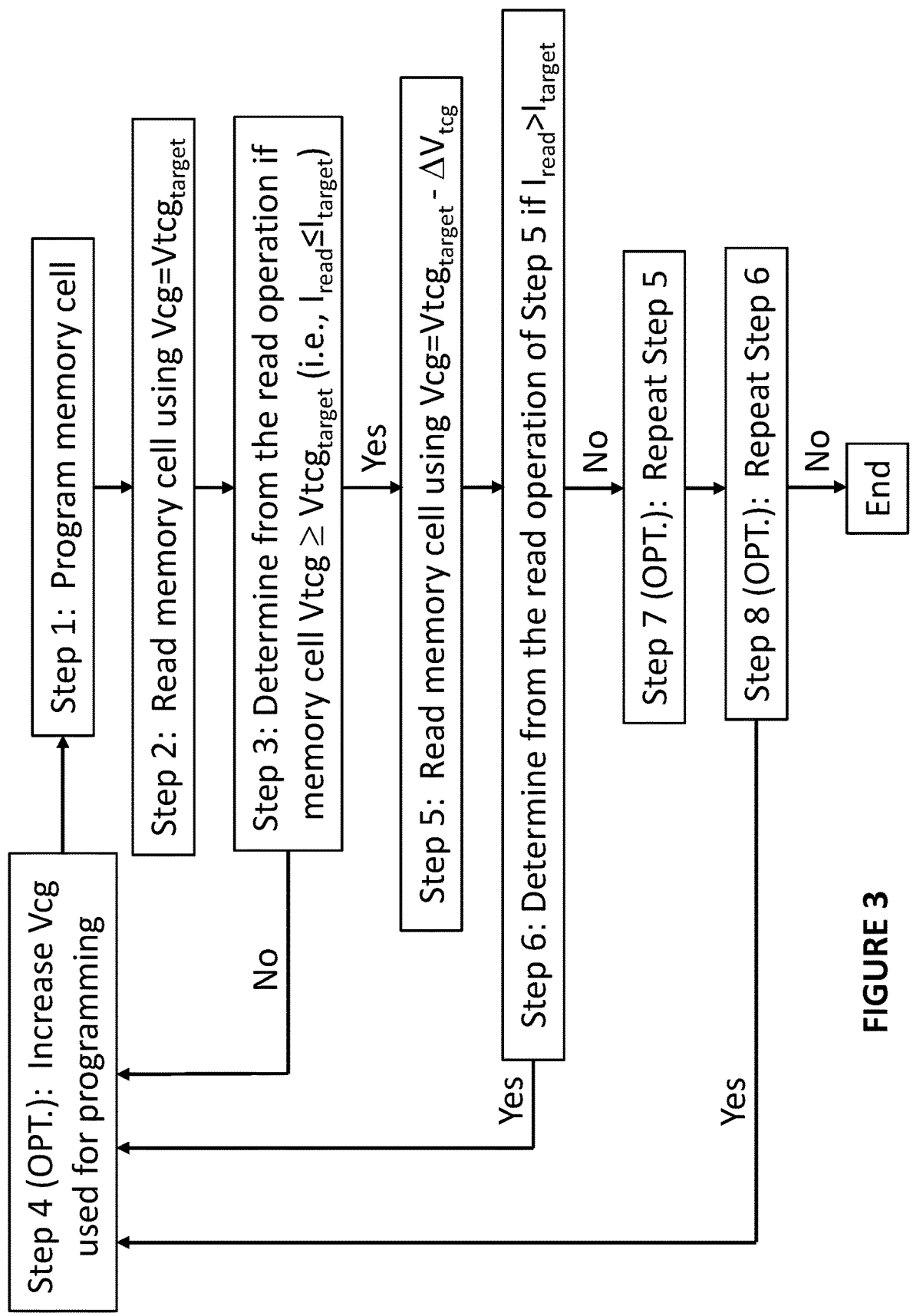
FIG. 3 is a flow diagram showing steps for programming memory cells.

An embodiment of the programming technique is illustrated in FIG. 3, which is implemented to program a memory cell to a specific programming state so that it has a target threshold voltage $Vtcg_{target}$. The technique begins in Step 1 with programming performed on a memory cell (e.g., a memory cell 10 having the configuration shown in FIG. 1). As described above, this programming operation preferably involves applying programming voltages to the memory cell 10 for a limited time (i.e., in one or more pulses), which results in injecting electrons onto the floating gate 20. In Step 2, a read operation is performed which involves applying read operation voltages to the memory cell 10 and measuring the current flowing through the channel region 18 of the memory cell 10. In this read operation, the voltage Vcg applied to the control gate 22 is the target threshold voltage $Vtcg_{target}$. In Step 3, it is determined from the read operation of Step 2 whether or not the threshold voltage Vtcg of the memory cell has reached or exceeded the target threshold voltage $Vtcg_{target}$ (i.e., whether the channel current $I_{read}$ is less than or equal to the target current $I_{target}$, where $I_{read}$ equal to the target current $I_{target}$ is indicative of the threshold voltage Vtcg of the memory cell reaching the target threshold voltage $Vtcg_{target}$). If the determination is no (that the threshold voltage Vtcg is not greater than or equal to, i.e. less, than the target threshold voltage $Vtcg_{target}$), then in Step 4 the voltage on the control gate Vcg used for programming is optionally increased, and then Step 1 is repeated. Steps 1-4 are repeated in order until it is determined in Step 3 that the threshold voltage Vtcg of the memory cell has reached or exceeded the target threshold voltage $Vtcg_{target}$ (i.e., that the channel current $L_{ea}d$ is less than or equal to the target current $I_{target}$). At that point, the memory cell is considered initially programmed to its desired programming state (i.e. to its target threshold voltage $Vtcg_{target}$). It is at this point where conventional programming usually ended.

However, for the purposes of the present invention, the programming state achieved by Steps 1-4 is only an initial programming state that may call for additional programming. Specifically, if the programmed memory cell exhibits RTN, then electron(s) captured in interface trap(s) contribute to the measured threshold voltage Vtcg of the memory cell as part of programming. If/when the electron(s) are emitted from the interface trap(s) after programming has ended, then the threshold voltage Vtcg could drop by more than $\Delta Vtcg_{max}$ below the target threshold voltage $Vtcg_{target}$, where $\Delta Vtcg_{max}$ is the maximum tolerable read error in terms of Vtcg variation. A threshold voltage drop by more than $\Delta Vtcg_{max}$ is considered to be an intolerable error during read operation. Therefore, according the present invention, once there is a read operation that confirms the target threshold voltage $Vtcg_{target}$ has initially been reached (in Step 3), then, in Step 5, the memory cell is read again, but this time using a control gate voltage Vcg that is less than the target threshold voltage $Vtcg_{target}$ used in Step 2. Specifically, the control gate voltage Vcg used for this read operation is $Vtcg_{target}-\Delta V_{tcg}$, where $\Delta V_{tcg}$ is a relatively small amount and can be defined by the maximum tolerable read error. As a non-limiting example, $\Delta V_{tcg}$ can be equal to $\Delta Vtcg_{max}$ which, in turn, depends on specific product and its application, and can be, as an example, 20 mV. In Step 6, it is determined from the read operation of Step 5 whether or not the read current $I_{read}$ is greater than the target read current $I_{target}$. If the memory cell does not exhibit intolerable RTN, then the small decrease in control gate voltage Vcg during the read operation should lower the read current $I_{read}$ further below $I_{target}$, and the determination of Step 6 should be no. In that case, the memory cell can be considered properly programmed. However, if the memory cell does exhibit intolerable RTN, and if before or during this read operation there is interface trap electron emission, then the threshold voltage Vtcg of the memory cell will drop, resulting in a rise in read current $I_{read}$. If that rise in current exceeds $I_{target}$, then the memory cell is subjected to another round of programming starting at Step 4, and re-read again to confirm it is sufficiently programmed.

The advantage of the above described technique is that if the memory cell exhibits intolerable RTN, then it will end up getting more deeply programmed (i.e. higher Vtcg) than would otherwise be the case. This means that even if electron emission occurs, it is less likely that the memory cell threshold voltage Vtcg will drop below the target threshold voltage $Vtcg_{target}$ exceeding the tolerance level of $\Delta Vtcg_{max}$. This is because the memory cell is more deeply programmed above $Vtcg_{target}$ and future read operations will more accurately reflect the desired programming state of the memory cell within the tolerance level of $\Delta Vtcg$ variations.

It has been determined by the present inventors that in certain embodiments improved results can be obtained if Steps 5 and 6 are repeated in the case where the initial determination in Step 6 is negative. Doing so increases the likelihood of identifying if a memory cell exhibits intolerable RTN and therefore should be subjected to additional programming. Therefore, if the initial determination in Step 6 is negative from the first read operation of Step 5, then in Steps 7 and 8, the Steps 5 and 6 are optionally repeated, so that the memory cell is read a second time (Step 7) using $Vcg=Vtcg_{target}-\Delta Vtcg$ if the first read operation (Step 5) did not result in a read current greater than $I_{target}$, and returned to programming if in Step 8 it is determined $I_{read}$ exceeds $I_{target}$. If the memory cell is twice read using Vcg lower than $Vtcg_{target}$, and twice $I_{read}$ stays below $I_{target}$, then the memory cell is considered properly programmed to the target voltage $Vtcg_{target}$ and programming is completed. Further, while FIG. 3 shows a single repeat of Steps 5 and 6, in certain embodiments even further improved results may be achieved if Steps 5 and 6 are repeated as many times as a user decides to take, whereby the memory cell is subjected to further programming if any single read operation using $Vcg=Vtcg_{target}-\Delta Vtcg$ results in a read current $I_{read}$ that exceeds $I_{target}$.

Figure 4:
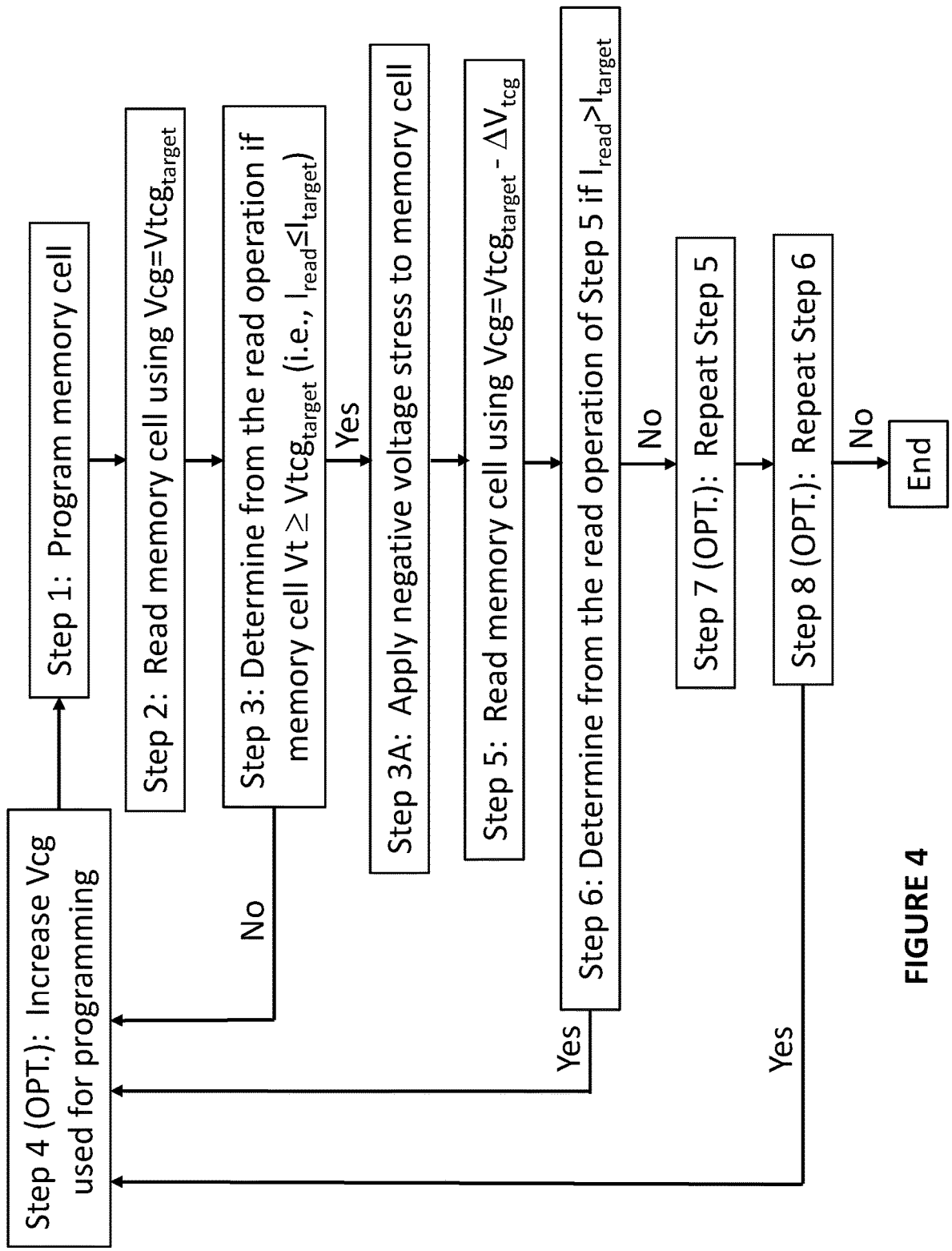
FIG. 4 is a flow diagram showing steps of a first alternate embodiment for programming memory cells.

FIG. 4 illustrates a first alternate embodiment, which is the same method as that described above and depicted in FIG. 3, except Step 3A is added after Step 3. Specifically, once the memory cell is initially programmed to reach its target threshold voltage $Vtcg_{target}$ (positive determination in Step 3), a negative voltage is applied to the memory cell (e.g. to the control gate, erase gate, and/or select gate). This negative voltage applied to the memory cell induces electric field stress on the gate oxide of the memory cell to stimulate the detrapping (emission) of electrons from the interface and near-interface oxide traps. Preferably, the negative voltage is applied to the control gate, but it can additionally or alternatively be applied to any gate or terminal that is capacitively coupled to the floating gate. Therefore, for a memory cell that has an oxide trap which produces RTN, the negative voltage will stimulate detrapping of electron, setting the threshold voltage Vtcg to a lower Vt state, and increasing the chances that the determination of Step 6 will be positive (and therefore the memory cell will be subjected to additional programming). Since RTN has an erratic behavior, a defective memory cell may stay in one Vtcg state during all read operations, whereby it will not be properly identified for additional programming. Therefore, application of a negative voltage (e.g., −1 V to −7 V) before the read operation of Step 5 will stimulate a memory cell with RTN to exhibit a lower Vt state and, thereby, be identified in Step 6 for additional programming, enhancing programming efficiency and accuracy. There is some characteristic time during which memory cells maintain their Vt state acquired under the applied voltage stress after its removal. Therefore, the delay between the negative voltage application of Step 3A and the read operation of Step 5 should preferably not be longer than typical electron capture and emission time (100 ms at room temperature, as an example), otherwise, application of the negative voltage prior to read operation may be less efficient.

Figure 5:
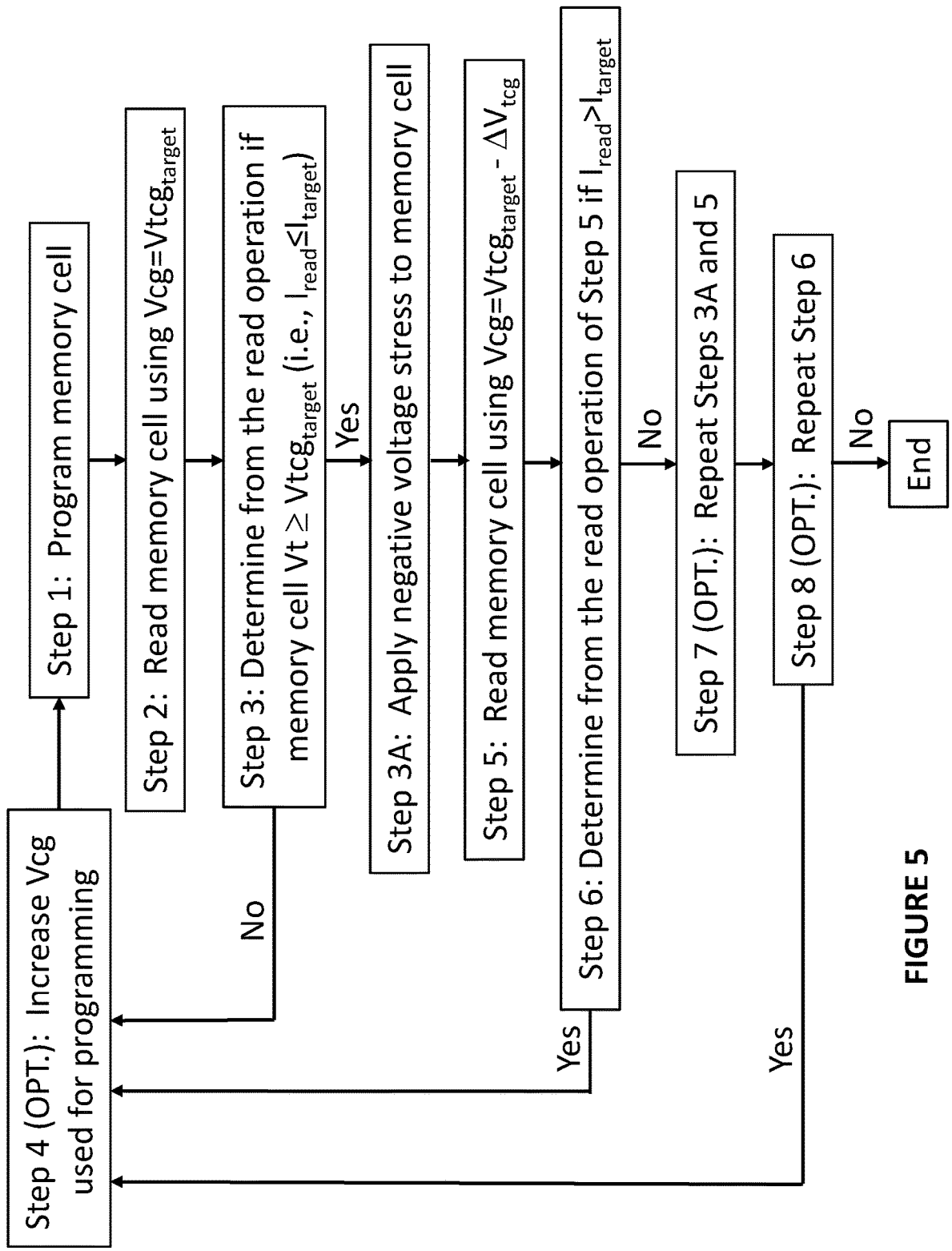
FIG. 5 is a flow diagram showing steps of a second alternate embodiment for programming memory cells.

FIG. 5 illustrates a second alternate embodiment, which is the same method as that described above and depicted in FIG. 4 for the first alternate embodiment, except the negative voltage is not only applied immediately before the initial read operation of Step 5, but it is also applied again before each repeated read operation of Step 5 (see Step 7, which repeats both Step 3A and Step 5, instead of just repeating just Step 5 as indicated in FIG. 4).

It is to be understood that the present invention is not limited to the embodiment(s) described above and illustrated herein but encompasses any and all variations falling within the scope of any claims. For example, references to the present invention herein are not intended to limit the scope of any claim or claim term, but instead merely relate to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed unless specified. Single layers of material could be formed as multiple layers of such or similar materials, and vice versa. The terms "forming" and "formed" as used herein shall include material deposition, material growth, or any other technique in providing the material as disclosed or claimed. The example of threshold voltage Vt used in the above described techniques is Vtcg, which is the threshold voltage of the memory cell as viewed from the control gate 22. However, the above described techniques could be implemented with respect to threshold voltage Vt as viewed from any one or more gates in the memory cell that is not floating. Finally, the present invention could be implemented in an array of memory cells with fewer gates than those in FIG. 1 (e.g., no erase gate and/or control gate combined with select gate).

What is claimed is:

1. A memory device, comprising:
a plurality of non-volatile memory cells each comprising a first gate; and
a controller configured to program one non-volatile memory cell of the plurality of non-volatile memory cells by:
programming the one non-volatile memory cell to an initial program state that corresponds to meeting or exceeding a target threshold voltage for the first gate of the one non-volatile memory cell, wherein the target threshold voltage corresponds to a target read current,
reading the one non-volatile memory cell in a first read operation using a read voltage applied to the first gate of the one non-volatile memory cell that is less than the target threshold voltage to generate a first read current, and
subjecting the one non-volatile memory cell to additional programming in response to determining that the first read current is greater than the target read current;
wherein the controller is configured to perform the programming of the one non-volatile memory cell to the initial program state by:
applying at least one first pulse of programming voltages to the one non-volatile memory cell,
reading the one non-volatile memory cell using a read voltage applied to the first gate of the one non-volatile memory cell that is equal to the target threshold voltage to generate a second read current, and
applying at least one second pulse of programming voltages to the one non-volatile memory cell in response to determining that the second read current is greater than the target read current.

2. The device of claim 1, wherein each of the plurality of non-volatile memory cells further comprises:
spaced apart source and drain regions formed in a semiconductor substrate, with a channel region of the substrate extending there between;
a floating gate disposed vertically over and insulated from a first portion of the channel region; and
a select gate disposed vertically over and insulated from a second portion of the channel region;
wherein for each of the plurality of non-volatile memory cells, the first gate is disposed vertically over and insulated from the floating gate.

3. The device of claim 2, wherein each of the plurality of non-volatile memory cells further comprises:
an erase gate disposed over and insulated from the source region.

4. The device of claim 1, wherein a voltage applied to the first gate as part of the second pulse of programming voltages is greater than a voltage applied to the first gate as part of the first pulse of programming voltages.

5. The device of claim 1, wherein the controller is further configured to:
read the one non-volatile memory cell in a second read operation, in response to determining that the first read current is not greater than the target read current in the first read operation, using a read voltage applied to the first gate of the one non-volatile memory cell that is less than the target threshold voltage to generate a second read current, and
subject the one non-volatile memory cell to additional programming in response to determining that the second read current is greater than the target read current.

6. The device of claim 5, wherein each of the plurality of non-volatile memory cells comprises a second gate, and wherein the controller is further configured to:
apply a negative voltage to the second gate of the one non-volatile memory cell after the programming of the one non-volatile memory cell to the initial program state and before the first read operation; and
apply a negative voltage to the second gate of the one non-volatile memory cell after the determining that the first read current is not greater than the target read current in the first read operation and before the second read operation.

7. The device of claim 1, wherein each of the plurality of non-volatile memory cells comprises a second gate, and wherein the controller is further configured to apply a negative voltage to the second gate of the one non-volatile memory cell after the programming of the one non-volatile memory cell to the initial program state and before the first read operation.

8. The device of claim 1, wherein the controller is further configured to apply a negative voltage to the first gate of the one non-volatile memory cell after the programming of the one non-volatile memory cell to the initial program state and before the first read operation.

9. A memory device comprising:
a plurality of non-volatile memory cells each comprising a first gate; and
a controller configured to program one non-volatile memory cell of the plurality of non-volatile memory cells by:
programming the one non-volatile memory cell to an initial program state that corresponds to meeting or exceeding a target threshold voltage for the first gate of the one non-volatile memory cell, wherein the target threshold voltage corresponds to a target read current,
reading the one non-volatile memory cell in a first read operation using a read voltage applied to the first gate of the one non-volatile memory cell that is less than the target threshold voltage to generate a first read current, and
subjecting the one non-volatile memory cell to additional programming in response to determining that the first read current is greater than the target read current;
wherein the controller is further configured to:
read the one non-volatile memory cell in a second read operation, in response to determining that the first read current is not greater than the target read current in the first read operation, using a read voltage applied to the first gate of the one non-volatile memory cell that is less than the target threshold voltage to generate a second read current, and
subject the one non-volatile memory cell to additional programming in response to determining that the second read current is greater than the target read current;
wherein the controller is further configured to:
apply a negative voltage to the first gate of the one non-volatile memory cell after the programming of the one non-volatile memory cell to the initial program state and before the first read operation; and
apply a negative voltage to the first gate of the one non-volatile memory cell after the determining that the first read current is not greater than the target read current in the first read operation and before the second read operation.

10. A method of programming one non-volatile memory cell of a plurality of non-volatile memory cells, wherein each of the plurality of non-volatile memory cells includes a first gate, the method comprising:
programming the one non-volatile memory cell to an initial program state that corresponds to meeting or exceeding a target threshold voltage for the first gate of the one non-volatile memory cell, wherein the target threshold voltage corresponds to a target read current,
reading the one non-volatile memory cell in a first read operation using a read voltage applied to the first gate of the one non-volatile memory cell that is less than the target threshold voltage to generate a first read current, and
subjecting the one non-volatile memory cell to additional programming in response to determining that the first read current is greater than the target read current;
wherein the programming of the one non-volatile memory cell to the initial program state comprises:
applying at least one first pulse of programming voltages to the one non-volatile memory cell;
reading the one non-volatile memory cell using a read voltage applied to the first gate of the one non-volatile memory cell that is equal to the target threshold voltage to generate a second read current; and
applying at least one second pulse of programming voltages to the one non-volatile memory cell in response to determining that the second read current is greater than the target read current.

11. The method of claim 10, wherein each of the plurality of non-volatile memory cells further comprises:
spaced apart source and drain regions formed in a semiconductor substrate, with a channel region of the substrate extending there between;
a floating gate disposed vertically over and insulated from a first portion of the channel region; and
a select gate disposed vertically over and insulated from a second portion of the channel region;
wherein for each of the plurality of non-volatile memory cells, the first gate is disposed vertically over and insulated from the floating gate.

12. The method of claim 11, wherein each of the plurality of non-volatile memory cells further comprises:
an erase gate disposed over and insulated from the source region.

13. The method of claim 10, wherein a voltage applied to the first gate as part of the second pulse of programming voltages is greater than a voltage applied to the first gate as part of the first pulse of programming voltages.

14. The method of claim 10, further comprising:
reading the one non-volatile memory cell in a second read operation, in response to determining that the first read current is not greater than the target read current in the first read operation, using a read voltage applied to the first gate of the one non-volatile memory cell that is less than the target threshold voltage to generate a second read current, and
subjecting the one non-volatile memory cell to additional programming in response to determining that the second read current is greater than the target read current.

15. The method of claim 14, wherein each of the plurality of non-volatile memory cells comprises a second gate, the method further comprising:
applying a negative voltage to the second gate of the one non-volatile memory cell after the programming of the one non-volatile memory cell to the initial program state and before the first read operation; and
applying a negative voltage to the second gate of the one non-volatile memory cell after the determining that the first read current is not greater than the target read current in the first read operation and before the second read operation.

16. The method of claim 10, wherein each of the plurality of non-volatile memory cells comprises a second gate, the method further comprising:
applying a negative voltage to the second gate of the one non-volatile memory cell after the programming of the one non-volatile memory cell to the initial program state and before the first read operation.

17. The method of claim 10, further comprising:
applying a negative voltage to the first gate of the one non-volatile memory cell after the programming of the one non-volatile memory cell to the initial program state and before the first read operation.

18. A method of programming one non-volatile memory cell of a plurality of non-volatile memory cells, wherein each of the plurality of non-volatile memory cells includes a first gate, the method comprising:
programming the one non-volatile memory cell to an initial program state that corresponds to meeting or exceeding a target threshold voltage for the first gate of the one non-volatile memory cell, wherein the target threshold voltage corresponds to a target read current,
reading the one non-volatile memory cell in a first read operation using a read voltage applied to the first gate of the one non-volatile memory cell that is less than the target threshold voltage to generate a first read current,
subjecting the one non-volatile memory cell to additional programming in response to determining that the first read current is greater than the target read current,
reading the one non-volatile memory cell in a second read operation, in response to determining that the first read current is not greater than the target read current in the first read operation, using a read voltage applied to the first gate of the one non-volatile memory cell that is less than the target threshold voltage to generate a second read current,
subjecting the one non-volatile memory cell to additional programming in response to determining that the second read current is greater than the target read current,
applying a negative voltage to the first gate of the one non-volatile memory cell after the programming of the one non-volatile memory cell to the initial program state and before the first read operation, and
applying a negative voltage to the first gate of the one non-volatile memory cell after the determining that the first read current is not greater than the target read current in the first read operation and before the second read operation.

* * * * *